(12) United States Patent
Gardner et al.

(10) Patent No.: US 6,188,107 B1
(45) Date of Patent: Feb. 13, 2001

(54) HIGH PERFORMANCE TRANSISTOR FABRICATED ON A DIELECTRIC FILM AND METHOD OF MAKING SAME

(75) Inventors: Mark I. Gardner, Cedar Creek; Frederick N. Hause; Derick J. Wristers, both of Austin, all of TX (US)

(73) Assignee: Advanced Micro Devices, Inc., Austin, TX (US)

( * ) Notice: Under 35 U.S.C. 154(b), the term of this patent shall be extended for 0 days.

(21) Appl. No.: 09/226,564

(22) Filed: Jan. 7, 1999

(51) Int. Cl.[7] .................................................. H01L 29/00
(52) U.S. Cl. .......................... 257/347; 257/348; 257/349; 257/350; 257/351; 257/352; 257/353; 257/354; 257/355
(58) Field of Search ...................... 257/347–355

(56) References Cited

U.S. PATENT DOCUMENTS

| 5,447,875 | 9/1995 | Mosiehi | 437/41 |
| 5,719,426 * | 2/1998 | Iwamatsu et al. | 257/347 |
| 5,792,697 | 8/1998 | Wen | 438/275 |
| 5,804,472 * | 9/1998 | Balasinisky et al. | 438/158 |
| 5,950,089 | 9/1999 | Wen | 438/275 |

FOREIGN PATENT DOCUMENTS 62-145850 * 6/1987 (JP) ........................................ 257/74

* cited by examiner

Primary Examiner—Fetsum Abraham
(74) Attorney, Agent, or Firm—Williams, Morgan & Amerson, P.C.

(57) ABSTRACT

The present invention is directed to a transistor formed above a layer of a dielectric material and a method of making same. In one illustrative embodiment, the method comprises forming a layer of dielectric material, forming a plurality of source/drain regions comprised of polysilicon above said layer of dielectric material and between said source/drain regions. The method further comprises forming a gate dielectric above said layer of polysilicon and forming a gate conductor above said gate dielectric. The transistor structure is comprised of a layer of dielectric material, a plurality of source/drain regions positioned above the layer of dielectric material, and a layer of polysilicon positioned above said layer of dielectric material and between said source/drain regions. The structure further comprises a gate dielectric positioned above said layer of polysilicon and a gate conductor positioned above said gate dielectric.

42 Claims, 4 Drawing Sheets

HIGH PERFORMANCE TRANSISTOR FABRICATED ON A DIELECTRIC FILM AND METHOD OF MAKING SAME

BACKGROUND OF THE INVENTION

1. Field of the Invention

The present invention is generally directed to the field of semiconductor processing, and, more particularly, to a high performance transistor fabricated on a dielectric layer and a method of making same.

2. Description of the Related Art

There is a constant drive within the semiconductor industry to increase the operating speed of integrated circuit devices, e.g., microprocessors, memory devices, etc. This drive is fueled by consumer demands for computers and electronic devices that operate at increasingly greater speeds. This demand for increased speed has resulted in a continual reduction in the size of semiconductor devices, e.g., transistors. That is, many components of a typical field effect transistor, e.g., channel length, junction depths, gate dielectric thickness, etc., are reduced. For example, all other things being equal, the smaller the channel length of the transistor, the faster the transistor will operate. Thus, there is a constant drive to reduce the size, or scale, of the components of a typical transistor to increase the overall speed of the transistor, as well as integrated circuit devices incorporating such transistors.

However, the reduction in the channel length also requires a reduction in the depth of the source and drain regions adjacent the gate conductor. As source/drain junctions get shallower, the implantation to prevent punch-through also gets shallower. In turn, the shallower punch-through implant tends to invade the space of the threshold voltage implant, i.e., the concentration of, for example, boron, tends to be greater at the surface of the silicon. This increased concentration of the punch-through dopant, in turn, tends to make the threshold voltage of the transistor higher. Increases in the threshold voltage of a transistor are undesirable for a number of reasons. For example, an increase in the threshold voltage tends to make the transistor harder to turn "ON" and may also result in the reduction of the drive current of the device.

The present invention is directed to a semiconductor device that minimizes or reduces some or all of the aforementioned problems and a method of making same.

SUMMARY OF THE INVENTION

The present invention is generally directed to a high performance transistor and a method of making same. The method comprises forming a layer of dielectric material, forming a first layer of polysilicon above the layer of dielectric material, and patterning the first layer of polysilicon to define a plurality of source/drain regions. The method further comprises forming a second layer of polysilicon at least between said source/drain regions and above the layer of dielectric material, forming a gate dielectric above the second layer of polysilicon, and forming a gate conductor above the gate dielectric.

The transistor structure of the present invention is comprised of a layer of dielectric material, a plurality of source/drain regions positioned above the layer of dielectric material, and a layer of polysilicon positioned between the source/drain regions and above the layer of dielectric material. The apparatus further comprises a gate dielectric positioned above the layer of polysilicon and a gate conductor positioned above the gate dielectric.

BRIEF DESCRIPTION OF THE DRAWINGS

The invention may be understood by reference to the following description taken in conjunction with the accompanying drawings, in which like reference numerals identify like elements, and in which.

Figure 1:
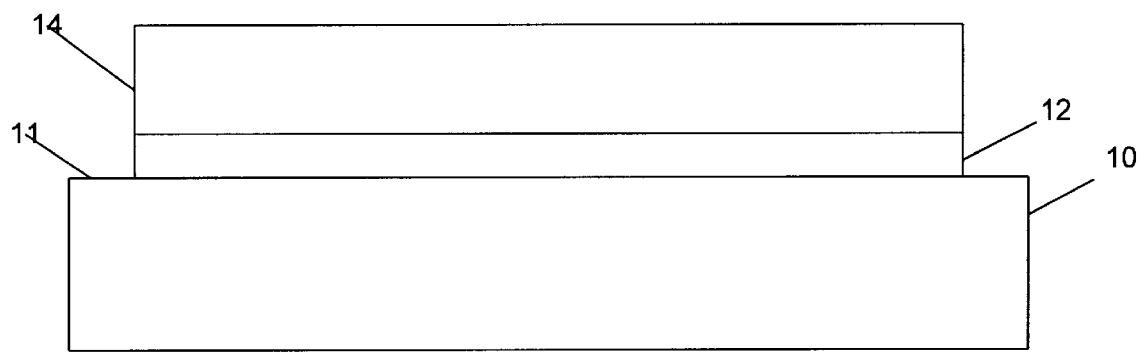
FIG. 1 is a cross-sectional view of a plurality of process layers formed above an illustrative semiconducting substrate.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to FIGS. 1–8. Although the various regions and structures of a semiconductor device are depicted in the drawings as having very precise and sharp configurations and profiles, those skilled in the art recognize that, in reality, these regions and structures are not as precise as indicated in the drawings. Additionally, the relative sizes of the various features depicted in the drawings may be exaggerated or reduced as compared to the size of those feature sizes on fabricated devices. Nevertheless, the attached drawings are included to describe and explain illustrative examples of the present invention.

In general, the present invention is directed to a high performance transistor fabricated above a layer of a dielectric material, and a method for making same. As will be readily apparent to those skilled in the art upon a complete reading of the present application, the present invention is applicable to a variety of technologies, e.g., NMOS, PMOS, CMOS, etc., and is readily applicable to a variety of devices, including, but not limited to, logic devices, memory devices, etc.

As shown in FIG. 1, a layer of dielectric material 12 is formed above a surface 11 of a structure 10, and a layer of polysilicon 14 is formed above the dielectric layer 12. In one illustrative embodiment, the structure 10 is comprised of a semiconducting substrate, such as silicon. However, the present invention is not limited to the formation of a transistor above a surface of a semiconducting substrate. Rather, as will be apparent to one skilled in the art upon a complete reading of the present disclosure, a transistor formed in accordance with the present invention may be formed above previously formed semiconductor devices, e.g., transistors, or other similar structure. In effect, the present invention may be used to form transistors on top of previously formed transistors.

The dielectric layer 12 may be formed form a variety of dielectric materials and may be formed by a variety of known techniques for forming such layers. For example, the dielectric layer 12 may be comprised of silicon dioxide, a nitrogen-bearing silicon dioxide, silicon nitride, silicon oxynitride, or it may be formed from other dielectric materials having a dielectric constant ("K") of less than approximately eight. The dielectric layer 12 may be formed by a variety of known techniques, including, but not limited to, thermal growing, chemical vapor deposition (CVD), sputtering, low pressure chemical vapor deposition (LPCVD), etc., and may have a thickness ranging from approximately 500–2000 Å. In one illustrative embodiment, the dielectric layer 12 is comprised of silicon dioxide having a thickness of approximately 500 Å that is formed by a CVD process. The layer of polysilicon 14 may be formed by a variety of known techniques for forming such layers, e.g., CVD, and may have a thickness ranging from approximately 500–3000 Å. Eventually, as described more fully below, portions of the polysilicon layer 14 will become the source/drain regions for a transistor.

Figure 2:
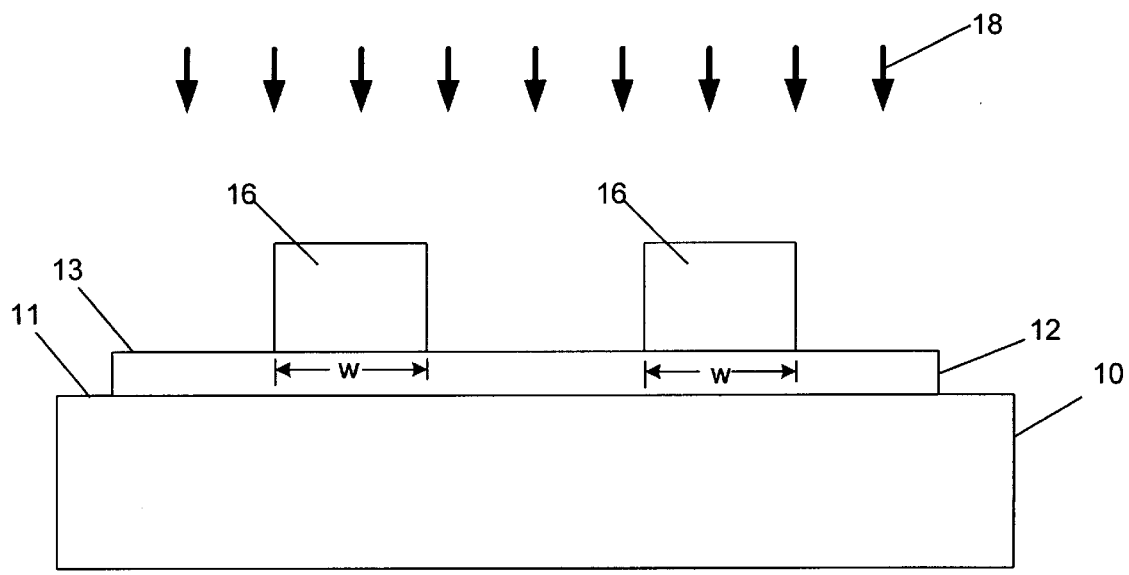
FIG. 2 is a cross-sectional view of the device shown in FIG. 1 after the uppermost process layer has been patterned.

Next, as shown in FIG. 2, the polysilicon layer 14 is patterned to define source/drain regions 16. The polysilicon layer 14 may be patterned using a variety of known photolithography and etching techniques, such as, for example, an anisotropic etching process using $SF_6$ as the etchant gas. The source/drain regions 16 have a width "W" which may be varied as a matter of design choice. For example, the width of each of the source/drain regions 16 may range from approximately 500–1500 Å.

Thereafter, as indicated by arrows 18, a dopant implantation process is performed to introduce dopant atoms into the source/drain regions 16. In one illustrative embodiment, the concentration of dopant atoms may range from approximately $3 \times 10^{15}$–$3 \times 10^{16}$ ions/cm$^2$ of the appropriate dopant atoms, e.g., arsenic for NMOS technology or boron for PMOS technology. Of course, during this implantation process, the dielectric layer 12 acts as a barrier to prevent the dopant atoms from penetrating much beyond the surface 13 of the dielectric layer 12. The device is next subjected to a heat treating process to drive the dopant atoms throughout the source/drain regions 16. The heat treating process may be performed by a variety of known techniques. For example, the heat treating process may be a rapid thermal anneal (RTA) process performed at a temperature ranging from approximately 1050–1200° C. for a time ranging from approximately 60 seconds to 2 minutes. Alternatively, the heat treating process may be performed in a traditional tube furnace at a temperature ranging from approximately 1000–1150° C. for a time period ranging from approximately 30–90 minutes.

As will be recognized by one skilled in the art, the doping of the source/drain regions 16 may be accomplished by a variety of different techniques. For example, if desired, the appropriate dopant atoms may be added during the formation of the polysilicon layer 14, i. e., dopant atoms, such as arsenic, may be added during the deposition process used to form the polysilicon layer 14. Alternatively, an undoped polysilicon layer 14 may be formed and thereafter subjected to an ion implantation process and heat treating process before etching is performed to define the source/drain regions 16. As will be known to those skilled in the art, there are a variety of other techniques and methods for introducing dopant atoms into the portion of the polysilicon layer 14 that will ultimately become the source/drain regions 16. Thus, the particular technique used to accomplish this objective should not be considered a limitation of the present invention.

Figure 3:
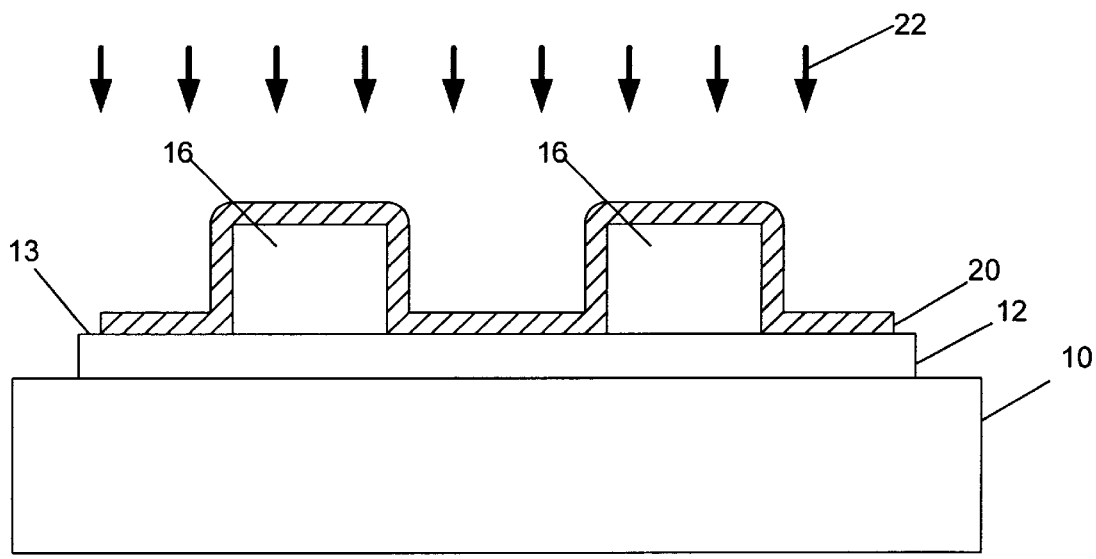
FIG. 3 is a cross-sectional view of the device shown in FIG. 2 after a conformal process layer has been formed thereabove.

Next, as shown in FIG. 3, a layer of polysilicon 20 is deposited above the dielectric layer 12 and the source/drain regions 16. This layer 20 may be formed by a variety of known techniques, e.g. CVD, LPCVD, plasma deposition, etc., and may have a thickness ranging from approximately 300–700 Å. Thereafter, as indicated by the arrows 22, the device is subjected to a threshold voltage ion implantation process to introduce the appropriate dopant atoms into the layer 20. In one illustrative embodiment, this may be accomplished by an ion implantation process at a dopant concentration of approximately $2$–$8 \times 10^{12}$ ions/cm$^2$ and at an energy level ranging from approximately 10–40 keV. Of course, the appropriate dopant atoms may be varied depending upon the technology involved, e.g., arsenic for NMOS, boron for PMOS.

Figure 4:
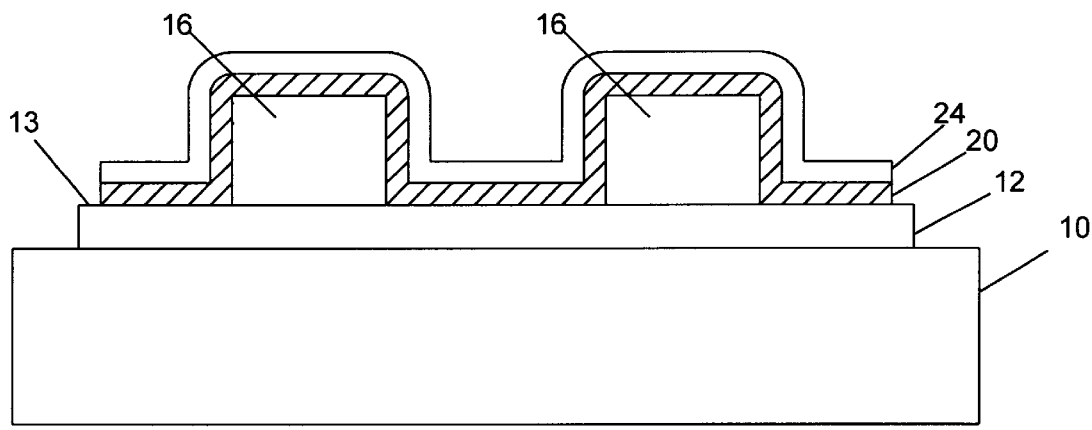
FIG. 4 is a cross-sectional view of the device shown in FIG. 3 after yet another conformal process layer has been formed thereabove.
Figure 5:
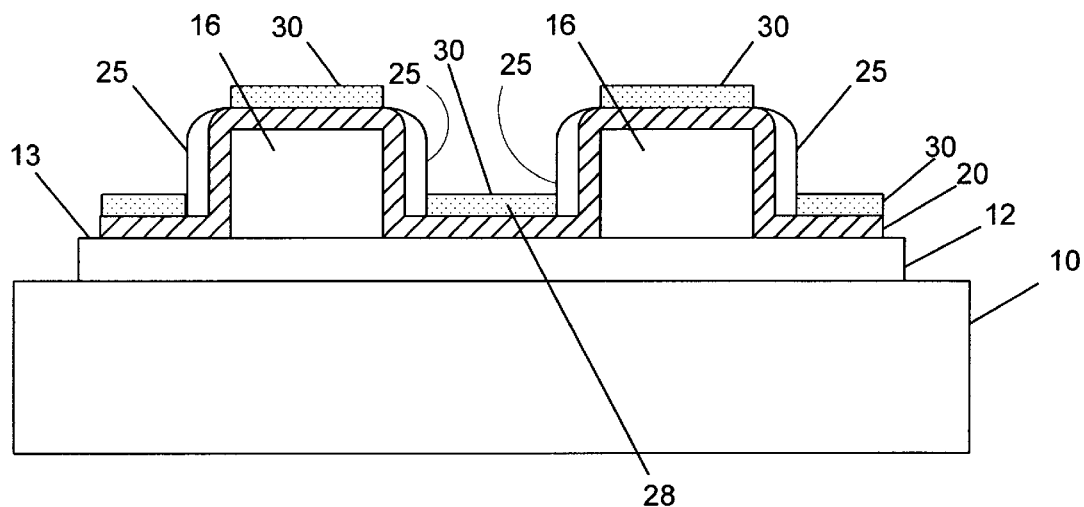
FIG. 5 is a cross-sectional view of the device shown in FIG. 4 after a plurality of sidewall spacers have been formed adjacent the source/drain regions of the device.

Next, as shown in FIG. 4, a process layer 24 is formed above the layer of polysilicon 20. The process layer 24 is comprised of a material that will ultimately be used to form sidewall spacers adjacent the source/drain regions 16. For example, the process layer 24 may be comprised of silicon dioxide, a nitrogen-bearing silicon dioxide, silicon nitride, silicon oxynitride, or other like materials, and may have a thickness ranging from approximately 200–500 Å. The process layer 24 may be formed by a variety of techniques, including, but not limited to, CVD, LPCVD, plasma deposition, etc. As shown in FIG. 5, an anisotropic etching process is thereafter performed to produce sidewall spacers 25 depicted therein. This anisotropic etching process may be performed using a variety of known techniques and equipment.

Next, as shown in FIG. 5, a gate dielectric 28 for the transistor is formed between the source/drain regions 16. In one illustrative embodiment, the formation of the gate dielectric 28 is accomplished by thermally growing a process layer 30 comprised of silicon dioxide or a nitrogen-bearing silicon dioxide on the exposed portions of the process layer 20. The gate dielectric 28 may be comprised of a variety of materials, such as silicon dioxide, a nitrogen-bearing silicon dioxide, or other dielectric materials, and the thickness of the gate dielectric 28 may be varied as a matter of design choice. Of course, the formation of the gate dielectric 28 may be accomplished by other techniques, such as a chemical vapor deposition process. If a deposition process is used to form the process layer 30, then the layer 30 would also cover the sidewall spacers 25. In one illustrative embodiment, the gate dielectric 28 is comprised of thermally grown silicon dioxide having a thickness ranging from approximately 15–25 Å.

Figure 6:
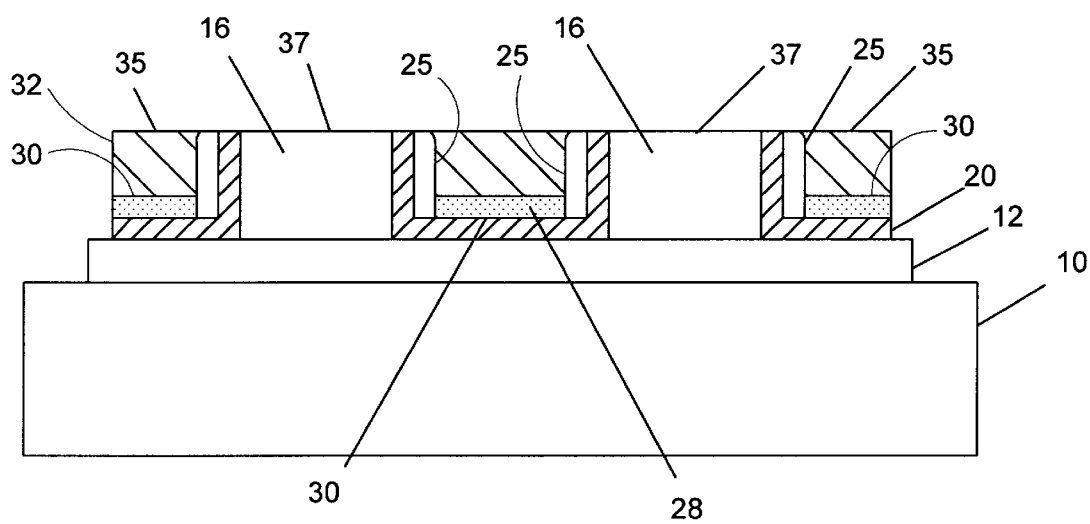
FIG. 6 is a cross-sectional view of the device shown in FIG. 5 after a layer of conductive material has been formed thereabove.

Next, as indicated in FIG. 6, a layer of conductive material 32 is formed. The conductive material 32 may be comprised of a variety of materials, such as a doped polysilicon, copper, aluminum, or other metals. After the layer of conductive material 32 is formed, a chemical mechanical polishing process may be performed such that a surface 35 of the layer of conductive material 32 is approximately even with a surface 37 of the source/drain regions 16. Note that, during this polishing process, the portions of the process layer 20 and the process layer 30 formed above the surface 37 of the source/drain regions 16 are removed.

Figure 7:
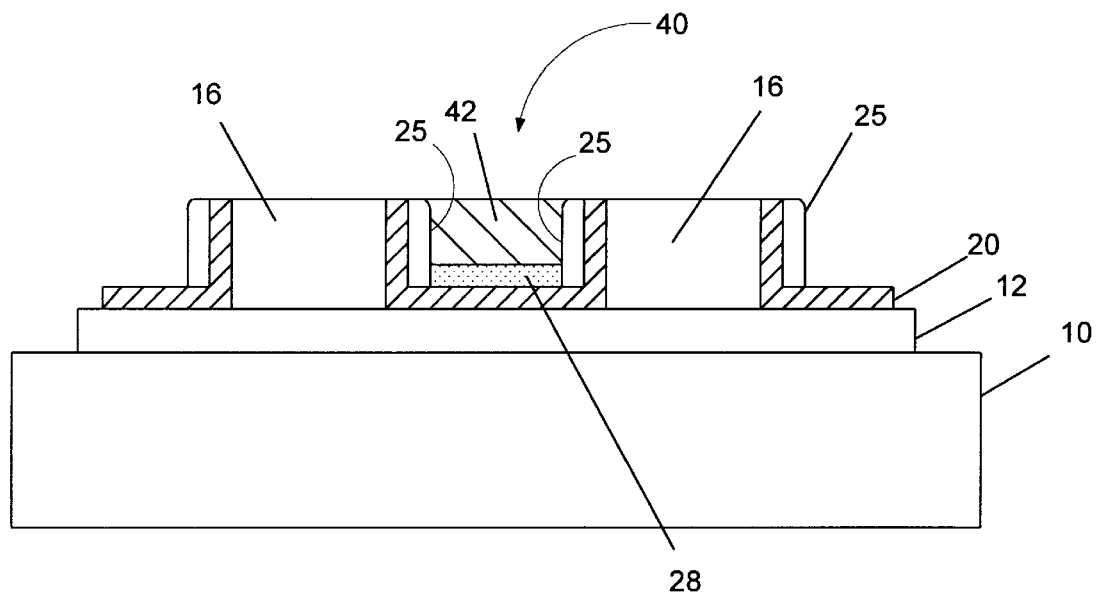
FIG. 7 is a cross-sectional view of one illustrative embodiment of the present invention.

Thereafter, as shown in FIG. 7, portions of the conductive layer 32 are removed by traditional photolithography and etching processes to define a transistor 40. The transistor 40 is comprised of source/drain regions 16, a gate dielectric 28 and a gate conductor 42. Thereafter, using known techniques, appropriate conductive lines and plugs may be formed above the transistor 40. As will be recognized by those skilled in the art, the sidewall spacers 25 act to insulate the gate conductor 42 from the source/drain regions 16. Of course, other techniques could be employed to form an insulator between the gate conductor 42 and the source/drain regions 16.

Figure 8:
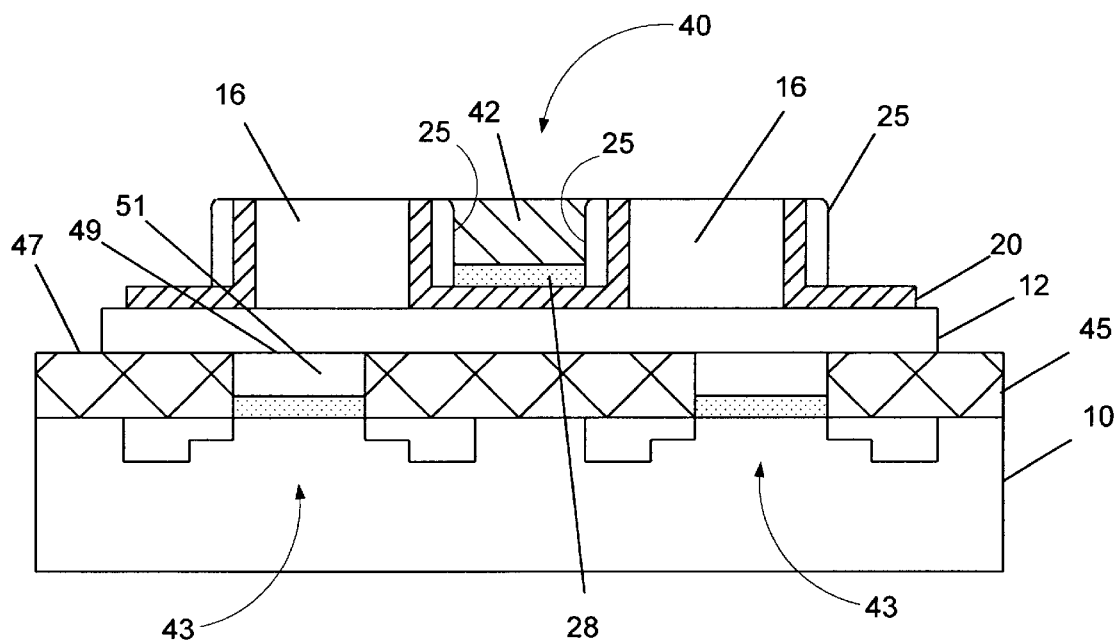
FIG. 8 is a cross-sectional view of one illustrative embodiment of the present invention that is formed above a plurality of pre-existing semiconductor devices.

As stated previously, the present invention may be used to form a plurality of transistors above other previously formed transistors, i.e., the present invention may be used to form multiple layers of transistors. For example, as shown in FIG. 8, a plurality of traditional semiconductor devices, e. g., transistors 43, may be formed above a structure 10 comprised of a silicon substrate using known techniques. Thereafter, a layer of appropriate dielectric material 45 may be formed above the plurality of transistors 43. For example, the dielectric layer 45 may be comprised of silicon dioxide, silicon oxynitride, PSG, BPSG, or other like materials.

Next, if desired, a surface 47 of the layer 45 may be planarized using a traditional chemical mechanical polishing technique. Thereafter, using the inventive method disclosed herein, a process layer 12 comprised of a dielectric material is formed above the layer 45, and the additional processes disclosed herein to form an illustrative transistor 40 are performed. As shown in FIG. 8, this illustrative embodiment results in the formation of multiple layers of transistors above a semiconducting substrate. Alternatively, the layer 45 may be formed of a sufficient thickness such that the surface 47 of the layer 45 extends above the surface 49 of the gate conductor 51 of the transistors 43. Using this alternative technique, depending upon the particular application under consideration, the formation of the process layer 12 may not be required. That is, using the techniques disclosed herein, the transistors 40 may be formed directly above the surface 47 of the dielectric layer 45.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A transistor structure, comprising:
    a layer of dielectric material;
    a plurality of source/drain regions formed from a first layer of polysilicon and positioned above said layer of dielectric material;
    a second layer of polysilicon positioned between said source/drain regions and above said layer of dielectric material;
    a gate dielectric positioned above said second layer of polysilicon; and
    a gate conductor positioned above said gate dielectric.

2. The transistor structure of claim 1, wherein said layer of dielectric material is comprised of silicon dioxide or a nitrogen-bearing silicon dioxide.

3. The transistor structure of claim 1, wherein said layer of dielectric material is comprised of a dielectric material having a dielectric constant less than approximately four.

4. The transistor structure of claim 1, wherein said gate conductor is comprised of a doped polysilicon or a metal.

5. The transistor structure of claim 1, wherein said gate conductor is comprised of a doped polysilicon, copper, or aluminum.

6. The transistor structure of claim 1, further comprising a plurality of sidewall spacers positioned above said second layer of polysilicon, each of said sidewall spacers being positioned between one of said source/drain regions and said gate conductor.

7. The transistor structure of claim 6, wherein said sidewall spacers are comprised of silicon dioxide, silicon nitride, or silicon oxynitride.

8. The transistor structure of claim 1, wherein:
    a portion of said second layer of polysilicon extends along a vertical sidewall of each of said source/drain regions; and
    each of a plurality of sidewall spacers is positioned between said portions of said second polysilicon layer and said gate dielectric and said gate conductor.

9. The transistor structure of claim 1, wherein said gate dielectric is positioned between said source/drain regions.

10. The transistor structure of claim 1, wherein at least a portion of said gate conductor is positioned between said source/drain regions.

11. The transistor structure of claim 1, wherein said gate conductor has an upper surface that is substantially planar with an upper surface of at least one of said source/drain regions.

12. The transistor structure of claim 1, wherein substantially all of said gate conductor is positioned between said source/drain regions.

13. A transistor structure, comprising:
    a layer of dielectric material;
    a plurality of source/drain regions formed from a first layer of polysilicon and positioned above said layer of dielectric material;
    a second layer of polysilicon positioned between said source/drain regions and above said layer of dielectric material;
    a gate dielectric positioned above said second layer of polysilicon;
    a gate conductor positioned above said gate dielectric; and
    a plurality of sidewall spacers positioned above said second layer of polysilicon, each of said sidewall spacers being positioned between one of said source/drain regions and said gate conductor.

14. The transistor structure of claim 13, wherein said layer of dielectric material is comprised of silicon dioxide or a nitrogen-bearing silicon dioxide.

15. The transistor structure of claim 13, wherein said layer of dielectric material is comprised of a dielectric material having a dielectric constant less than approximately four.

16. The transistor structure of claim 13, wherein said plurality of source/drain regions are comprised of a doped polysilicon.

17. The transistor structure of claim 13, wherein said gate dielectric is comprised of silicon dioxide or a nitrogen-bearing silicon dioxide.

18. The transistor structure of claim 13, wherein said gate conductor is comprised of a doped polysilicon or a metal.

19. The transistor structure of claim 13, wherein said gate conductor is comprised of a doped polysilicon, copper, or aluminum.

20. The transistor structure of claim 13, wherein said sidewall spacers are comprised of silicon dioxide, silicon nitride, or silicon oxynitride.

21. The transistor structure of claim 13, wherein:
a portion of said second layer of polysilicon extends along a vertical sidewall of each of said source/drain regions; and
each of a plurality of sidewall spacers is positioned between said portions of said second polysilicon layer and said gate conductor.

22. The transistor structure of claim 13, wherein said gate dielectric is positioned between said source/drain regions.

23. The transistor structure of claim 13, wherein at least a portion of said gate conductor is positioned between said source/drain regions.

24. The transistor structure of claim 13, wherein said gate conductor has an upper surface that is substantially planar with an upper surface of at least one of said source/drain regions.

25. The transistor structure of claim 13, wherein substantially all of said gate conductor is positioned between said source/drain regions.

26. An integrated circuit device comprised of multiple layers of transistors, comprising:
a first plurality of transistors formed above a surface of a semiconducting substrate, each of said transistors having a gate conductor;
a layer of dielectric material positioned above said substrate, said layer of dielectric material having a surface that extends above the gate conductors of said first plurality of transistors;
a second plurality of transistors formed above the surface of said layer of dielectric material, each of said second plurality of transistors comprising:
a plurality of source/drain regions formed from a first layer of polysilicon and positioned above said layer of dielectric material;
a second layer of polysilicon positioned between said source/drain regions and above the surface of said layer of dielectric material;
a gate dielectric positioned above said second layer of polysilicon; and
a gate conductor positioned above said gate dielectric.

27. The integrated circuit device of claim 26, wherein said plurality of source/drain regions are comprised of a doped polysilicon.

28. The integrated circuit device of claim 27, wherein said gate dielectric is comprised of silicon dioxide.

29. The integrated circuit device of claim 28, wherein the gate conductor positioned above the gate dielectric is comprised of a doped polysilicon, copper, or aluminum.

30. The integrated circuit device of claim 26, wherein said gate dielectric is positioned between said source/drain regions.

31. The integrated circuit device of claim 26, wherein at least a portion of said gate conductor of said second plurality of transistors is positioned between said source/drain regions.

32. The integrated circuit device of claim 26, wherein said gate conductor of said second plurality of transistors has an upper surface that is substantially planar with an upper surface of at least one of said source/drain regions.

33. The integrated circuit device of claim 26, wherein substantially all of said gate conductor of said second plurality of transistors is positioned between said source/drain regions.

34. An integrated circuit device comprised of multiple layers of transistors, comprising:
a first plurality of transistors formed above a surface of a semiconducting substrate, each of said transistors having a gate conductor;
a layer of dielectric material positioned above said first plurality of transistors, said layer of dielectric material having a surface;
a second plurality of transistors formed above the surface of said layer of dielectric material, each of said second plurality of transistors comprising:
a plurality of source/drain regions formed from a first layer of polysilicon and positioned above said layer of dielectric material;
a second layer of polysilicon positioned between said source/drain regions and above the surface of said layer of dielectric material;
a gate dielectric positioned above said second layer of polysilicon; and
a gate conductor positioned above said gate dielectric.

35. The integrated circuit device of claim 34, wherein said plurality of source/drain regions are comprised of a doped polysilicon.

36. The integrated circuit device of claim 34, wherein said gate dielectric is comprised of silicon dioxide.

37. The integrated circuit device of claim 34, wherein the gate conductor positioned above the gate dielectric is comprised of a doped polysilicon, copper, or aluminum.

38. The integrated circuit device of claim 34, wherein said layer of dielectric material is comprised of silicon dioxide.

39. The integrated circuit device of claim 34, wherein said gate dielectric is positioned between said source/drain regions.

40. The integrated circuit device of claim 34, wherein at least a portion of said gate conductor of said second plurality of transistors is positioned between said source/drain regions.

41. The integrated circuit device of claim 34, wherein said gate conductor of said second plurality of transistors has an upper surface that is substantially planar with an upper surface of at least one of said source/drain regions.

42. The integrated circuit device of claim 34, wherein substantially all of said gate conductor of said second plurality of transistors is positioned between said source/drain regions.

* * * * *